United States Patent
Yoon et al.

(10) Patent No.: US 7,884,347 B2
(45) Date of Patent: Feb. 8, 2011

(54) PHASE-CHANGE MEMORY DEVICE AND METHOD OF FABRICATING THE SAME

(75) Inventors: Sung Min Yoon, Daejeon (KR); Byoung Gon Yu, Daejeon (KR); Soon Won Jung, Daejeon (KR); Seung Yun Lee, Daejeon (KR); Young Sam Park, Daejeon (KR); Joon Suk Lee, Bucheon-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/425,152

(22) Filed: Apr. 16, 2009

(65) Prior Publication Data

US 2010/0012915 A1    Jan. 21, 2010

(30) Foreign Application Priority Data

Jul. 17, 2008    (KR) .................... 10-2008-0069493

(51) Int. Cl.
 *H01L 29/06* (2006.01)
(52) U.S. Cl. ............ 257/4; 257/2; 257/3; 257/E29.234; 257/E45.002; 438/95; 438/102; 438/409; 365/163; 365/222; 365/200
(58) Field of Classification Search .............. 257/2, 257/3, 4, 40, 200, 248, 295, 296, 379, 536, 257/E29.234, E45.002, E47.001; 438/95, 438/102, 409; 365/200, 222; 369/13.01
See application file for complete search history.

(56) References Cited

U.S. PATENT DOCUMENTS

2001/0041304 A1* 11/2001 Uno et al. .............. 430/270.13

(Continued)

FOREIGN PATENT DOCUMENTS

KR    1020060016418 A    2/2006

(Continued)

OTHER PUBLICATIONS

Feng Rao et al., "Investigation on the stabilization of the median resistance state for phase change memory cell with doublelayer chalcogenide films," American Institute of Physics, 2007, 123511-1 ~ 2.

(Continued)

*Primary Examiner*—Lynne A Gurley
*Assistant Examiner*—Yosef Gebreyesus (57) ABSTRACT

A phase-change memory device in which a phase-change material layer has a multilayered structure with different compositions and a method of fabricating the same are provided. The phase-change memory device includes a first electrode layer formed on a substrate, a heater electrode layer formed on the first electrode layer, an insulating layer formed on the heater electrode layer and having a pore partially exposing the heater electrode layer, a phase-change material layer formed to fill the pore and partially contacting the heater electrode layer, and a second electrode layer formed on the phase-change material layer. The main operating region functioning as a memory operating region is formed of a $Ge_2Sb_{2+x}Te_5$ phase-change material to ensure the stability of a memory operation, and simultaneously, the subsidiary regions formed of a $Ge_2Sb_2Te_5$ phase-change material are disposed respectively on and under the $Ge_2Sb_{2+x}Te_5$ main operating region to prevent leakage of thermal energy through an electrode, thereby reducing power consumption.

19 Claims, 7 Drawing Sheets

U.S. PATENT DOCUMENTS

| | | | |
|---|---|---|---|
| 2003/0214857 A1* | 11/2003 | Horie et al. | 365/200 |
| 2005/0051901 A1 | 3/2005 | Chen | |
| 2006/0012008 A1* | 1/2006 | Campbell | 257/536 |
| 2007/0034849 A1 | 2/2007 | Sandoval et al. | |
| 2007/0097739 A1* | 5/2007 | Happ et al. | 365/163 |
| 2007/0108431 A1* | 5/2007 | Chen et al. | 257/4 |
| 2008/0042119 A1 | 2/2008 | Sandoval et al. | |
| 2009/0078924 A1* | 3/2009 | Liang et al. | 257/3 |
| 2009/0180314 A1* | 7/2009 | Liu | 365/163 |
| 2009/0231911 A1* | 9/2009 | Liu et al. | 365/163 |

FOREIGN PATENT DOCUMENTS

| | | |
|---|---|---|
| KR | 1020060039996 A | 5/2006 |
| KR | 1020060089401 A | 8/2006 |
| KR | 1020070047724 A | 5/2007 |
| KR | 1020080051777 A | 6/2008 |

OTHER PUBLICATIONS

Hyuk Choi et al., "Characteristic improvement of $Ge_1Se_1Te_2$ phase change memory by the heating method and the device structure change," ScienceDirect, 2007, pp. 1606-1609, Published by Elsevier B.V.

* cited by examiner

PHASE-CHANGE MEMORY DEVICE AND METHOD OF FABRICATING THE SAME

CROSS-REFERENCE TO RELATED APPLICATION

This application claims priority to and the benefit of Korean Patent Application No. 10-2008-0069493, filed Jul. 17, 2008, the disclosure of which is incorporated herein by reference in its entirety.

BACKGROUND

1. Field of the Invention

The present invention relates to a phase-change memory device and a method of fabricating the same, and more particularly, to a phase-change memory device in which a phase-change material layer has a multilayered structure with different compositions and a method of fabricating the same.

2. Discussion of Related Art

Semiconductor memories may be categorized as either volatile memories or nonvolatile memories. A volatile memory loses stored data when power supply is interrupted. In contrast, a nonvolatile memory retains stored data even if power supply is abruptly interrupted. With recent advancements in mobile applications such as personal data terminals, the use of nonvolatile memories in various portable devices has markedly increased.

A phase-change random access memory (PRAM) device is an advanced nonvolatile memory device that has lately attracted considerable attention because it exhibits much better operating performance than a flash memory, which is the most widely used nonvolatile memory device at present, and it can easily replace the flash memory in the new era of hyperfine silicon device processes.

The PRAM is fabricated using a phase-change material whose resistance varies according to its crystalline phase. In order to enable a memory operation, the PRAM controls the crystalline state of the phase-change material with application of current or voltage under appropriate conditions to store data, and determines the kind of the stored data based on a variation in resistance according to the crystalline state of the phase-change material. The phase-change material has a low resistance in a crystalline phase and a high resistance in an amorphous phase. For the PRAM, an operation of changing a high-resistance amorphous phase into a low-resistance crystalline phase is referred to as a set operation, while an operation of changing the low-resistance crystalline phase into the high-resistance amorphous phase is referred to as a reset operation.

In order to put PRAMs to practical use, solutions to the following technical issues need to be furnished.

First, power consumption required for driving PRAMs should be reduced. Since a PRAM is driven by controlling the crystalline state of the phase-change material using Joule heat generated due to supply of current to a resistor, it consumes relatively high power. When PRAMs were fabricated using a conventional semiconductor process applied to large-sized devices, too much power and heat for the entire system were generated, so that it was impossible to realize PRAMs with practical operating characteristics.

However, since semiconductor devices have been remarkably scaled down with the continual shrinkage of design scales, it became possible to considerably reduce power consumption required for the operations of PRAMs with currently used design rules of semiconductor processes. However, an operating current required by PRAMs is not yet sufficiently low. In order to commercialize PRAMs as advanced nonvolatile memories, it is necessary to further reduce their operating current.

Second, it is required to further reduce the size of memory cells. In order to successfully replace a flash memory by a PRAM, not only the size of the PRAM but also the size of a memory cell comprised of the PRAM and a transistor device need considerable reduction. A PRAM cell cannot be configured with a PRAM alone; it requires integration of a PRAM and a driving device functioning as a switch for supplying current to the memory device.

In this case, the driving device may be a complementary metal-oxide-semiconductor (CMOS) transistor, a bipolar transistor, or a two-terminal diode. For example, a PRAM cell comprised of a CMOS transistor and a PRAM may have a cell size of about 15 to 20 $F^2$, and a PRAM cell including a bipolar transistor and a PRAM may have a cell size of about 10 to 12 $F^2$. In this case, the PRAM cells have cell sizes even larger than conventional NOR and NAND flash memory cells. Accordingly, in order to strengthen the price competitiveness of PRAMs against flash memories, the cell size of PRAM cells should be reduced to at least about 5 $F^2$.

However, even if the sizes of the PRAM and driving device could be sufficiently reduced by the most advanced semiconductor microfabrication processes, applicability of those processes is greatly limited because conventional PRAMs require excessively large operating currents. It turns out that shrinking the size of memory cells is closely related to reducing their operating currents.

Third, memory devices should be capable of operating at high speed. As explained above, a PRAM employs the reversible transition of a phase-change material between a crystalline phase and an amorphous phase. Transition to a high-resistance amorphous phase is relatively very quick, because it is accompanied by processes of melting and rapidly cooling the phase-change material. In contrast, transition to a low-resistance crystalline phase takes a certain minimum amount of time to crystallize the phase-change material. Accordingly, the phase-change material needs to be crystallized quickly for the PRAM to operate at high speed.

A conventional PRAM may operate at a speed of several tens of ns to several hundred ns, which is much higher than the operating speed of a typical nonvolatile flash memory. However, it is necessary to further increase the operating speed of PRAMs in order to develop advanced integrated PRAMs capable of replacing not only flash memories but also dynamic random access memories (DRAMs) and static random access memories (SRAMs).

Meanwhile, when each device requires an excessively large operating current for a write operation, the number of devices capable of writing data at the same time is reduced. As a result, it is likely to take more time to write needed data in a memory device with a predetermined capacity. Accordingly, it can be seen that improving the operating speed of the PRAM is closely associated with reducing its power consumption.

Finally, the operating reliability of PRAMs needs to be ensured by meeting the following three operating conditions.

First, heat generated during a memory operation of a specific memory device must not destroy or change data stored in an adjacent memory device. In particular, it is highly likely that an interval between devices in highly integrated memory arrays will continue to decrease. In some cases, heat generated during a memory operation of a specific cell may function as noise that hinders a memory operation of an adjacent cell. In a typical memory array operation, this phenomenon is called crosstalk. In the case of a PRAM, a reduction in operating current is advantageous in inhibiting crosstalk and stabilizing operation of a memory array. In other words, the PRAM needs to operate with low power to minimize a rise in the temperature of each memory cell. Accordingly, it is essential to develop a low-power structure in order to ensure reliable memory operations of highly integrated PRAMs.

Second, after data is written in a PRAM, it should be retained as is over time in the operating environment of the PRAM. In other words, set or reset data written in the PRAM should be maintained for a long period of time, even in the high-temperature conditions under which a chip including a memory array actually operates.

Third, even if a PRAM repeats a write operation, data should be stably stored. Although the number of times a PRAM is capable of repeating a write operation is known to be about 108 times, this is optimum data obtained using a test device fabricated under the optimum conditions. Considering deviation in the characteristics of individual memory devices constituting an actual memory array, the number of times a PRAM is actually capable of repeating a write operation is estimated to be about 105 to 107 times. Although the number of times the PRAM is capable of repeating a write operation is larger than the number of times a flash memory is capable of repeating a write operation, it is still too small to develop a new market for embedded memories and advanced integrated nonvolatile memories that will supersede SRAMs and DRAMs.

As described above, technical issues that need solutions in order to enable the practical use of PRAMs are closely connected and cannot be solved separately. In other words, in order to downscale PRAMs and increase their operating speed, their power consumption must be reduced first. Also, when the amount of heat generated during a memory operation is reduced by reducing the operating current of a PRAM, and the volume of a phase-change material required for the memory operation is reduced, the operating reliability of the PRAM may be greatly improved.

Accordingly, in order to put PRAMs to practical use, it is necessary to develop a new PRAM structure that solves all of the problems related to power consumption, device size, operating speed, and operating reliability.

SUMMARY OF THE INVENTION

The present invention is directed to a phase-change memory device and a method of fabricating the same, and more particularly, to a phase-change memory device in which a phase-change material layer has a multilayered structure with different compositions and a method of fabricating the same.

One aspect of the present invention provides a phase-change memory device including: a first electrode layer formed on a substrate; a heater electrode layer formed on the first electrode layer; an insulating layer formed on the heater electrode layer and having a pore partially exposing the heater electrode layer; a phase-change material layer formed to fill the pore and partially contacting the heater electrode layer; and a second electrode layer formed on the phase-change material layer. The phase-change material layer includes: a main operating region formed of a germanium (Ge)-antimony (Sb)-tellurium (Te) phase-change material; and subsidiary regions disposed respectively on and under the main operating region and formed of a Ge—Sb—Te phase-change material having a different composition from the main operating region.

Another aspect of the present invention provides a method of fabricating a phase-change memory device. The method includes: providing a substrate; forming a first electrode layer on the substrate; forming a heater electrode layer on the first electrode layer; forming an insulating layer on the heater electrode layer; forming a pore partially exposing the heater electrode layer in the insulating layer; forming a phase-change material layer partially contacting the heater electrode layer in the pore; and forming a second electrode layer on the phase-change material layer. The phase-change material layer includes: a main operating region formed of a Ge—Sb—Te phase-change material; and subsidiary regions disposed respectively on and under the main operating region and formed of a Ge—Sb—Te phase-change material having a different composition from the main operating region.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. These embodiments are provided to ensure that this disclosure is thorough and fully enables those skilled in the art to embody and practice the invention. In the drawings, the thicknesses of layers and regions may be exaggerated for clarity. It will also be understood that when a layer is referred to as being "on" another layer or substrate, it can be directly on the other layer or substrate or intervening layers may also be present. Throughout the drawings, like elements are denoted by like reference numerals.

Figure 1:
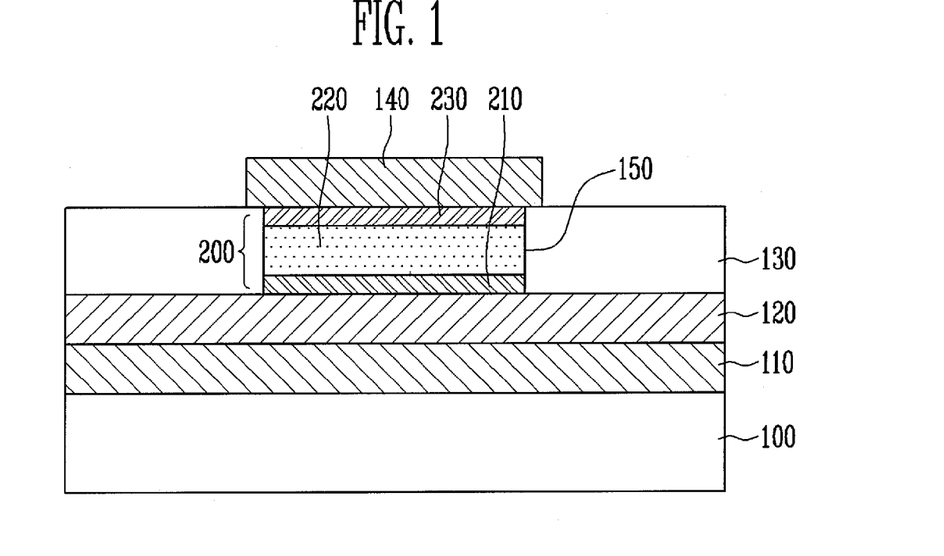
FIG. 1 is a cross-sectional view of a phase-change random access memory (PRAM) according to an exemplary embodiment of the present invention.

FIG. 1 is a cross-sectional view of a phase-change random access memory (PRAM) according to an exemplary embodiment of the present invention.

Referring to FIG. 1, the PRAM may include a substrate 100, a first electrode layer 110, a heater electrode layer 120, a first insulating layer 130, a phase-change material layer 200, and a second electrode layer 140.

The substrate 100 may be a silicon semiconductor substrate, a silicon substrate having a silicon oxide layer obtained by thermally oxidizing the top surface of the silicon substrate, or a substrate on which a complementary metal oxide semiconductor (CMOS) transistor or bipolar transistor constituting a circuit for driving the PRAM is arranged.

The first electrode layer 110 may be formed on the substrate 100 and function as a lower terminal of the PRAM. The first electrode layer 110 may be formed of a low-resistance metal, such as platinum (Pt), tungsten (W), or a titanium/tungsten alloy (TiW).

The heater electrode layer 120 may be formed on the first electrode layer 110 and used to generate heat required for changing a crystalline state of a phase-change material. In this case, heat may be generated by the heater electrode layer 120 due to current supplied through the first electrode layer 110, and the heater electrode layer 120 may have a higher resistance than the first electrode layer 110. In one exemplary embodiment of the present invention, the heater electrode layer 120 may be formed of one selected from the group consisting of titanium nitride (TiN), titanium oxynitride (TiON), titanium aluminum nitride (TiAlN), titanium silicon nitride (TiSiN), tantalum aluminum nitride (TaAlN), tantalum silicon nitride (TaSiN), and silicon germanium (SiGe).

The first insulating layer 130 may be formed on the heater electrode layer 120 and used to electrically or thermally insulate the phase-change material layer 200. In one exemplary embodiment, the first insulating layer 130 may be a silicon-based insulating layer, such as a silicon oxide layer or a silicon nitride (SiN) layer.

A pore 150 may be formed in the first insulating layer 130 to partially expose the heater electrode layer 120. Thus, the phase-change material layer 200 is in contact with the heater electrode layer 120 through the pore 150. The size of the pore 150 may directly affect the operating characteristics of the PRAM. For example, current required for a memory operation may be reduced by reducing the size of the pore 150.

The phase-change material layer 200 may be formed to fill the pore 150 of the first insulating layer 130, and thus it may contact the heater electrode layer 120 exposed by the pore 150.

In this case, the phase-change material layer 200 may be formed of a phase-change material $(Ge_2Sb_{2+x}Te_5$ $(0.12 \leq x \leq 0.32))$ obtained by adding an excess of antimony (Sb) to $Ge_2Sb_2Te_5$ (GST) with a composition ratio of 2:2:5 among germanium (Ge)-antimony (Sb)-tellurium (Te) metal alloys. In this case, the amount "x" of Sb added to $Ge_2Sb_2Te_5$ may range from 0.12 to 0.32. The phase-change material expressed by $Ge_2Sb_{2+x}Te_5 (0.12 \leq x \leq 0.32)$ may have the following merits.

A GST material formed of Ge, Sb, and Te in a composition ratio of 2:2:5, which is conventionally used to embody a PRAM, has a face-centered-cubic (FCC) crystalline phase, which is a meta-stable phase, and a hexagonal-closed-packing (HCP) crystalline phase, which is a stable phase, according to temperature. In this case, the resistance of the GST material is typically higher in the FCC phase than in the HCP phase. When an optical data storage medium is embodied using the GST material with the above-described composition, since a difference in refractive index between a GST crystalline phase and a GST amorphous phase is detected by laser beam irradiation, a difference in the resistance between the FCC phase and the HCP phase does not greatly affect storage and reproduction of data.

However, in a PRAM that writes and reads data based on electrical resistance switched between a crystalline phase and an amorphous phase, generation of a crystalline phase with two structures may cause an increase in the distribution of set resistance in the set operation and a variation in the condition for the next reset operation. Accordingly, by use of a $Ge_2Sb_{2+x}Te_5(0.12 \leq x \leq 0.32)$ phase-change material layer that has a single crystalline phase during a crystallization process, the PRAM can stably perform set operations.

Also, the PRAM may experience various high-temperature environments during its operations. When a specific PRAM is put into a third state where its resistance is lower than a common reset resistance and higher than a common set resistance, the PRAM cannot stably perform subsequent reset and set write operations.

Accordingly, by use of a phase-change material layer formed of $Ge_2Sb_{2+x}Te_5(0.12 \leq x \leq 0.32)$ whose crystalline phase in a set state is fixed as a single phase and whose reset resistance can be maintained at a high temperature for a long time, the PRAM can have stable and excellent operating characteristics.

Meanwhile, in order to improve the operating characteristics of the PRAM, the phase-change material layer 200 may include a main operating region 220 formed of a phase-change material with a composition of $Ge_2Sb_{2+x}Te_5$ $(0.12 \leq x \leq 0.32)$, and first and second subsidiary regions 210 and 230 disposed respectively under and on the main operating region 220 and formed of a phase-change material with a composition of $Ge_2Sb_2Te_5$. In an exemplary embodiment of the present invention, the phase-change material layer 200 may include either one of the first and second subsidiary regions 210 and 230.

In this case, the main operating region 220 formed of $Ge_2Sb_{2+x}Te_5(0.12 \leq x \leq 0.32)$ may function as a main operating layer for performing a phase-change memory operation, and the first and second subsidiary regions 210 and 230 may function as subsidiary layers for improving the operating performance of the PRAM.

In the PRAM according to the present invention, the phase-change material layer 200 is comprised of the first and second subsidiary regions 210 and 230 formed of a $Ge_2Sb_2Te_5$ phase-change material disposed respectively under and on the main operating region 220 formed of a $Ge_2Sb_{2+x}Te_5$ $(0.12 \leq x \leq 0.32)$ phase-change material so that the following effects can be obtained.

First, since the $Ge_2Sb_2Te_5$ phase-change material has a lower thermal conductivity than a metal electrode layer, heat generated during the operation of the PRAM may be prevented from easily dissipating through the heater electrode layer 120 and the first and second electrode layers 110 and 140. As a result, the leakage of thermal energy for inducing phase transition may be inhibited, thereby reducing the operating current of the PRAM.

Second, the crystallization speed of the $Ge_2Sb_{2+x}Te_5$ $(0.12 \leq x \leq 0.32)$ phase-change material constituting the main operating region 220 can be increased. In general, a $Ge_2Sb_2Te_5$ phase-change material forms an intermediate crystalline phase with an FCC crystal structure under the domination of a mechanism of crystal nuclei generation. However, since the Sb-excess $Ge_2Sb_{2+x}Te_5$ phase-change material has a single crystalline structure and undergoes a crystallization process under the domination of a mechanism of crystal grain boundary growth, the crystallization process is not performed until HCP single-crystalline nuclei are generated. Thus, the $Ge_2Sb_2Te_5$ phase-change material is typically crystallized at a higher speed than the $Ge_2Sb_{2+x}Te_5$ ($0.12 \leq x \leq 0.32$) phase-change material. Based on the above-described phenomenon, the first and second subsidiary regions 210 and 230 formed of the $Ge_2Sb_2Te_5$ phase-change material may be disposed under and on the main operating region 220. As a result, the first and second subsidiary regions 210 and 230 can generate crystal nuclei at high speed during the set operation of the PRAM and the crystallization speed of the main operating region 220 can be accelerated under the influence of the crystal nuclei. Due to the acceleration of the crystallization speed of the main operating region 220 for performing an actual memory operation, the PRAM also can operate at higher speed.

Third, the first and second subsidiary regions 210 and 230 are disposed between the main operating region 220 formed of an Sb-excess $Ge_2Sb_{2+x}Te_5$ phase-change material and the electrode layers 110, 120, and 140, so that inter-diffusion between the excess of Sb added to the main operating region 220 and elements of the electrode layers 110, 120, and 140 can be prevented. Thus, variations in the compositions of the phase-change material layer 200 and the electrode layers 110, 120, and 140 can be prevented, thereby increasing the number of times the PRAM is capable of repeating a write operation.

In an exemplary embodiment, each of the first and second subsidiary regions 210 and 230 may be formed to a smaller thickness than the main operating region 220. In this case, the main operating region 220 may be formed to a thickness at least twice as great as the sum of the thicknesses of the first and second subsidiary regions 210 and 230. Also, the thicknesses of the first and second subsidiary regions 210 and 230 may be determined considering the following two conditions.

First, since the first and second subsidiary regions 210 and 230 are used to shield thermal energy and prevent inter-diffusion between elements, each of them should be formed to at least a sufficient thickness to produce both the thermal shielding effect and the inter-diffusion prevention effect.

Second, since the PRAM according to the present invention utilizes the operating stability of the main operating region 220 formed of an Sb-excess $Ge_2Sb_{2+x}Te_5$ phase-change material, the thickness of each of the first and second subsidiary regions 210 and 230 should be controlled not to degrade the operating stability of the main operating region 220.

Considering the above-described conditions, each of the first and second subsidiary regions 210 and 230 should be formed to a thickness of about 500 to 1000 Å. For example, when the total thickness of the phase-change material layer 200 is about 3000 Å, the main operating region 220 may be formed to a thickness of about 2000 Å and each of the first and second subsidiary regions 210 and 230 may be formed to a thickness of about 500 Å.

The second electrode layer 140 may be formed on the insulating layer 130 and the phase-change material layer 200 and serve as an upper terminal of the PRAM. In an exemplary embodiment of the present invention, the second electrode layer 140 may be formed of a low-resistance metal, such as platinum (Pt), tungsten (W), or a titanium-tungsten (TiW) alloy.

FIGS. 2A through 2F are cross-sectional views illustrating a process of fabricating a PRAM according to an exemplary embodiment of the present invention.

Figure 2A:
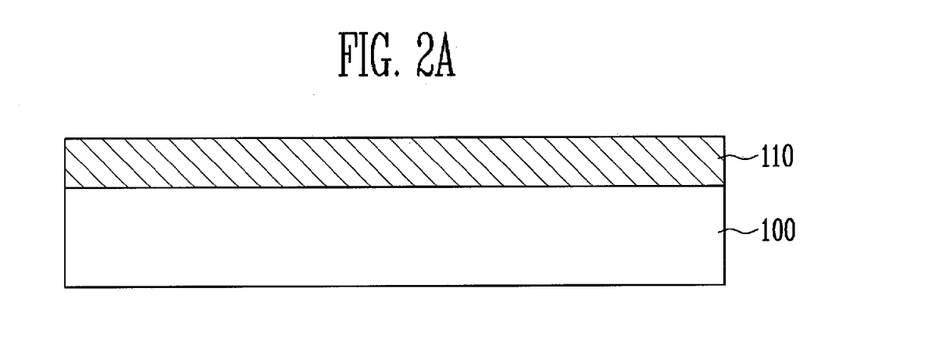
FIGS. 2A through 2F are cross-sectional views illustrating a process of fabricating a PRAM according to an exemplary embodiment of the present invention.

Referring to FIG. 2A, a substrate 100 may be prepared. In an exemplary embodiment of the present invention, the substrate 100 may be a silicon (Si) substrate or a substrate having a silicon oxide layer formed by thermally oxidizing the top surface of a Si substrate.

A first electrode layer 110 may be formed on the substrate 100. The first electrode layer 110 may be formed using a sputtering process, an electronic beam (e-beam) evaporation process, or a thermal evaporation process. In an exemplary embodiment of the present invention, the first electrode layer 110 may be formed of a titanium-tungsten (TiW) alloy to a thickness of about 2000 Å using a sputtering process.

Figure 2B:
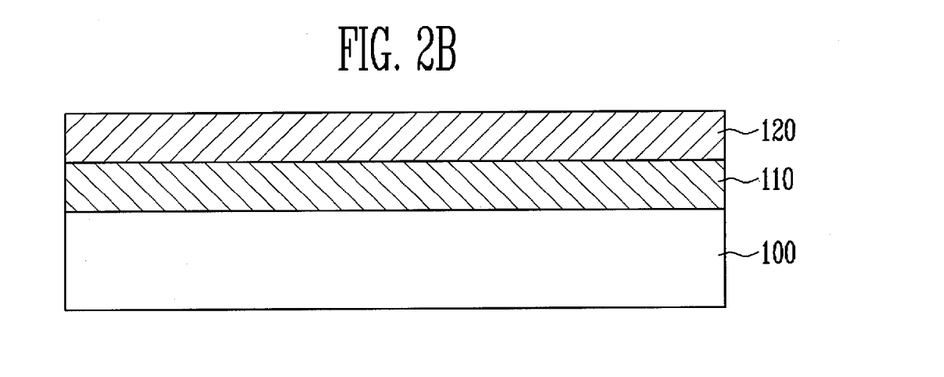

Referring to FIG. 2B, a heater electrode layer 120 may be formed on the first electrode layer 110. The heater electrode layer 120 may be obtained using a sputtering process, an e-beam evaporation process, or a thermal evaporation process.

In an exemplary embodiment of the present invention, the heater electrode layer 120 may be a titanium nitride (TiN) thin layer formed to a thickness of about 500 Å using a sputtering process. In this case, the resistivity of the heater electrode layer 120 may be adjusted to the PRAM by controlling the content of nitrogen gas, which is one of sputtering conditions. In an exemplary embodiment, the heater electrode layer 120 may be formed to have a resistivity of about 500 $\mu\Omega \cdot cm$.

Figure 2C:
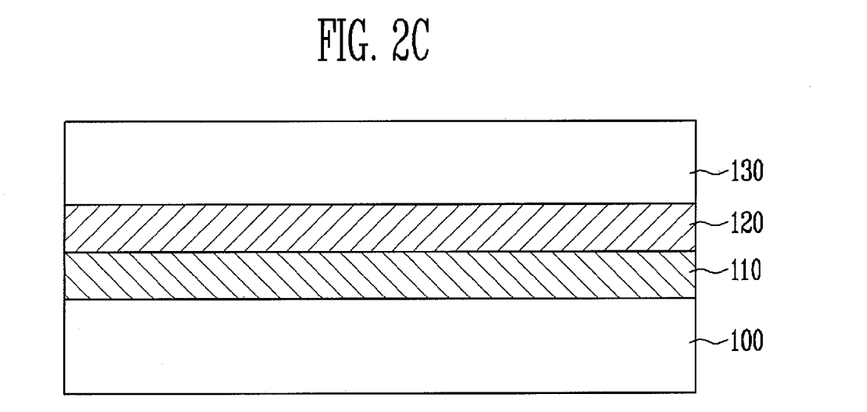

Referring to FIG. 2C, a insulating layer 130 may be formed on the heater electrode layer 120. In an exemplary embodiment of the present invention, when the insulating layer 130 is formed of silicon oxide at a low temperature using a chemical vapor deposition (CVD) process, oxidation of the heater electrode layer 120 may be prevented.

Also, an appropriate device isolation process may be carried out due to the formation of the insulating layer 130. Specifically, when the insulating layer 130 is formed of silicon oxide, a portion to be defined as a PRAM region may be ensured using a dry or wet etching process, thereby separating each memory device. According to an exemplary embodiment, the insulating layer 130 may be formed of silicon oxide ($SiO_2$) to a thickness of about 1000 Å using a plasma-enhanced CVD (PECVD) process.

Figure 2D:
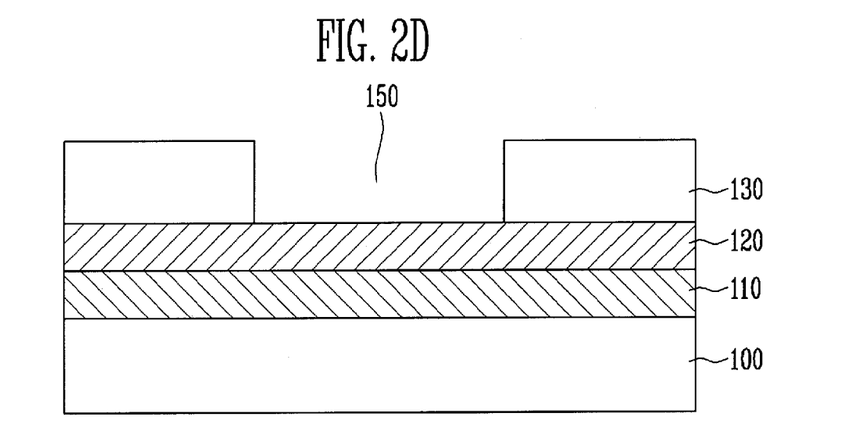

Referring to FIG. 2D, the insulating layer 130 may be etched to form a pore 150 partially exposing the heater electrode layer 120. In this case, the size of the pore 150 may be 500 nm or less, and preferably, but not necessarily, about 50 to 500 nm, although it depends on the kind of a lithography process and the conditions of an etch process.

In addition to an i-line lithography system, a high-resolution patterning apparatus, such as a KrF lithography system, an ArF lithography system, or an e-beam lithography system, may be used as a lithography apparatus. In an exemplary embodiment of the present invention, the pore 150 may be formed to a size of 500 nm×500 nm by an i-line lithography process using a photoresist mask.

Figure 2E:
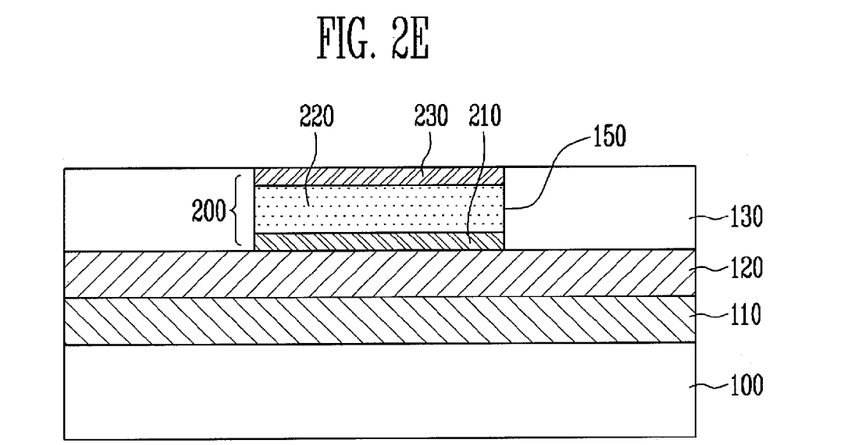

Referring to FIG. 2E, a phase-change material layer 200 may be formed in the pore 150. In this case, the phase-change material layer 200 may include a main operating region 220 and first and second subsidiary regions 210 and 230. The main operating region 220 may be formed of a phase-change material with a composition of $Ge_2Sb_{2+x}Te_5$ ($0.12 \leq x \leq 0.32$). The first and second subsidiary regions 210 and 230 may be respectively disposed under and on the main operating region 220 and formed of a phase-change material with a composition of $Ge_2Sb_2Te_5$. The main operating region 220 and the first and second subsidiary regions 210 and 230 may be sequentially formed using a sputtering process.

The process of forming the phase-change material layer 200 in the pore 150 is most essential for fabrication of the PRAM according to the present invention, and thus a detailed description thereof will now be presented.

The multilayered phase-change material layer 200 including the main operating region 220 and the first and second subsidiary regions 210 and 230 may be formed using a radio-frequency (RF) magnetron sputtering process. In this case, a $Ge_2Sb_2Te_5$ target with a composition ratio of 2:2:5 and an Sb target may be used as sputtering targets, and an Sb composition of $Ge_2Sb_{2+x}Te_5$ constituting the main operating region 220 may be changed by modifying the sputtering power applied to the Sb target. In an exemplary embodiment of the present invention, in order to form the main operating region 220, a sputtering power of about 100 W may be applied to the $Ge_2Sb_2Te_5$ target, and a sputtering power of 20 W may be applied to the Sb target. Meanwhile, the first and second subsidiary regions 210 and 230 may be formed by a sputtering process using only the $Ge_2Sb_2Te_5$ target without the Sb target.

Thereafter, the phase-change material layer 200 may be formed in a desired position using an appropriate patterning process. In this case, the patterning of the phase-change material layer 200 may include a dry or wet etching process or a lift-off process using a photoresist pattern already patterned to have a pore. Alternatively, the patterning of the phase-change material layer 200 may include removing a portion of the phase-change material layer 200 formed outside the pore 150 using a chemical mechanical polishing (CMP) technique.

Figure 2F:
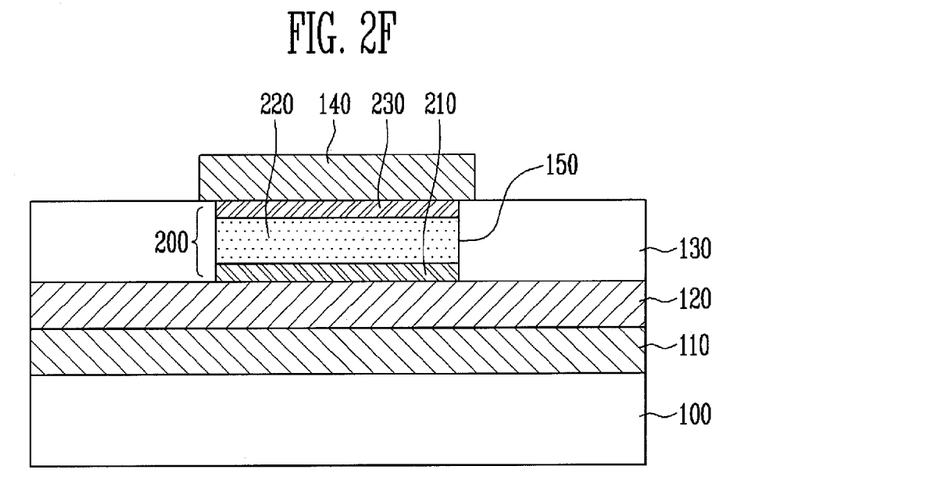

Referring to FIG. 2F, a second electrode layer 140 may be formed on the phase-change material layer 200 formed to fill the pore 150. The second electrode layer 140 may be formed using a sputtering process, an e-beam evaporation process, or a thermal evaporation process. In an exemplary embodiment of the present invention, the second electrode layer 140 may be a tungsten (W) electrode formed to a thickness of about 1000 Å using a sputtering process.

In an exemplary embodiment, before the second electrode layer 140 is formed, a second insulating layer (not shown) may be formed on the phase-change material layer 200 and etched, thereby additionally forming a via hole (not shown) exposing the phase-change material layer 200. In this case, the second electrode layer 140 may contact the phase-change material layer 200 through the via hole.

Figure 3:
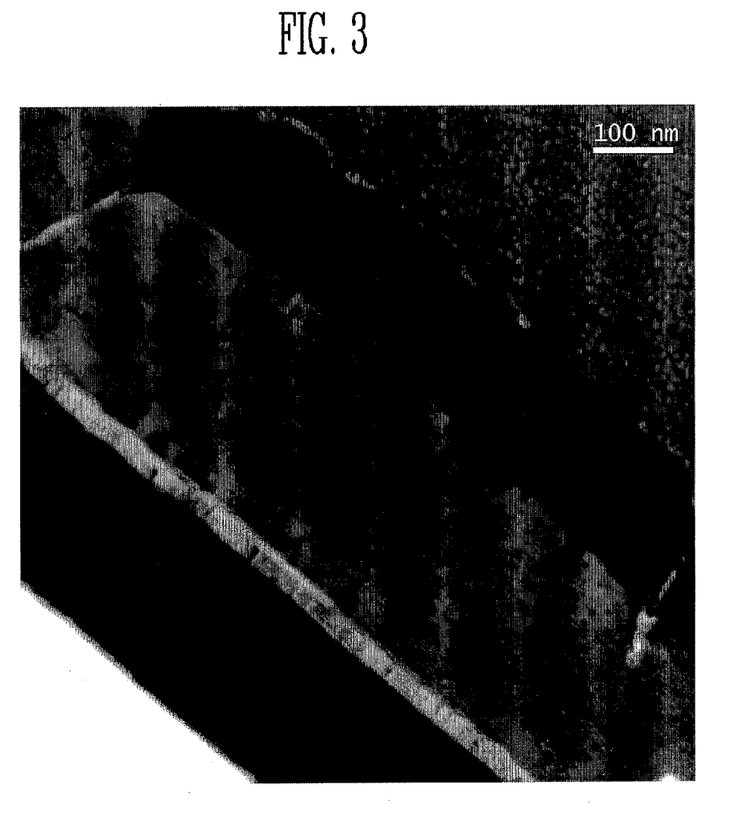
FIG. 3 is a transmission electron microscope (TEM) image of a section of a PRAM according to an exemplary embodiment of the present invention.

FIG. 3 is a transmission electron microscope (TEM) image of a section of a PRAM according to an exemplary embodiment of the present invention Referring to FIG. 3, it can be observed that a phase-change material layer of the PRAM according to the present invention includes three layers, that is, a main operating region and two subsidiary regions. Also, it can be seen that the subsidiary regions formed of a phase-change material with a composition of $Ge_2Sb_2Te_5$ have a different fine structure from the main operating region formed of a phase-change material with a composition of $Ge_{18}Sb_{39}Te_{43}$.

Figure 4:
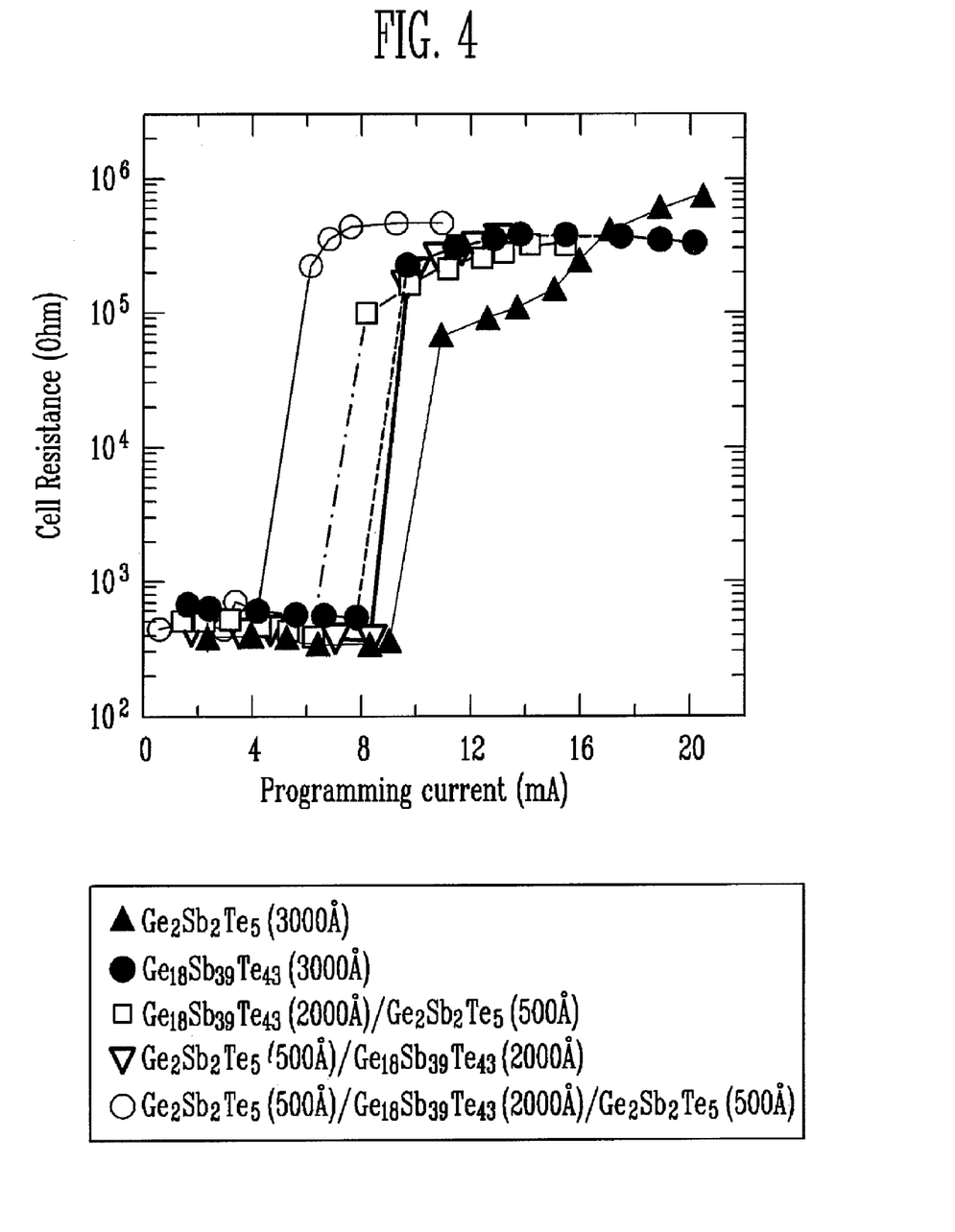
FIG. 4 is a graph of a current consumed for a reset operation of PRAMs according to exemplary embodiments of the present invention and comparative PRAMs.

FIG. 4 is a graph of a current consumed for a reset operation of PRAMs according to exemplary embodiments of the present invention and comparative PRAMs.

In order to compare the consumed currents of the PRAMs according to the present invention, a first device using a 3000 Å-thick $Ge_2Sb_2Te_5$ phase-change material layer, a second device using a 3000 Å-thick $Ge_{18}Sb_{39}Te43$ phase-change material layer, a third device using a phase-change material layer having a 2000 Å-thick $Ge_{18}Sb_{39}Te_{43}$ region and a 500 Å-thick $Ge_2Sb_2Te_5$ region disposed on the $Ge_{18}Sb_{39}Te_{43}$ region, a fourth device using a phase-change material layer having a 2000 Å-thick $Ge_{18}Sb_{39}Te_{43}$ region and a 500 Å-thick $Ge_2Sb_2Te_5$ region disposed under the $Ge_{18}Sb_{39}Te_{43}$ region, and a fifth device using a phase-change material layer having a 2000 Å-thick $Ge_{18}Sb_{39}Te_{43}$ region and two 500 Å-thick $Ge_2Sb_2Te_5$ regions disposed respectively on and under the $Ge_2Sb_2Te_5$ region were prepared, and a current consumed for a reset operation of each of the first through fifth devices was measured.

Referring to FIG. 4, the largest operating current for a reset program operation was consumed by the first PRAM, followed by the third PRAM, the second PRAM, the fourth PRAM, and finally the fifth PRAM. From this result, the following points may be considered.

First, the third, fourth, and fifth PRAMs, each of which used the phase-change material layer having the $Ge_2Sb_2Te_5$ region subsidiary region on and/or under the $Ge_{18}Sb_{39}Te_{43}$ region according to the present invention, consumed smaller operating currents than the first and second PRAMs that do not adopt a multilayered structure. Accordingly, it can be seen that a PRAM according to the present invention can operate with a smaller reset current because thermal energy used during the operation of the PRAM is effectively shielded by a subsidiary region.

Second, each of the third and fourth PRAMs having a double phase-change material layer consumed a smaller reset current than the second PRAM having a single $Ge_{18}Sb_{39}Te_{43}$ phase-change material layer. Also, the fourth PRAM having the subsidiary region disposed under the main operating region consumed a smaller reset current than the third PRAM.

Although both upper and lower subsidiary regions function to shield thermal energy, the lower subsidiary region may shield thermal energy more effectively than the upper subsidiary region. In addition, it can be confirmed that the upper subsidiary region may have a good thermal shielding effect only in cooperation with the lower subsidiary region.

Since the $Ge_2Sb_2Te_5$ phase-change material constituting the lower subsidiary region has a higher resistance than a heater electrode layer even in a crystalline phase, the lower subsidiary region may not only shield thermal energy but also function as an additional thin heater layer for supplying more thermal energy along with the heater electrode layer.

As a result, the PRAM using the $Ge_{18}Sb_{39}Te_{43}$ main operating region and the $Ge_2Sb_2Te_5$ subsidiary regions disposed respectively on and under the $Ge_{18}Sb_{39}Te_{43}$ main operating region according to the present invention can greatly reduce the operating current.

Figure 5A:
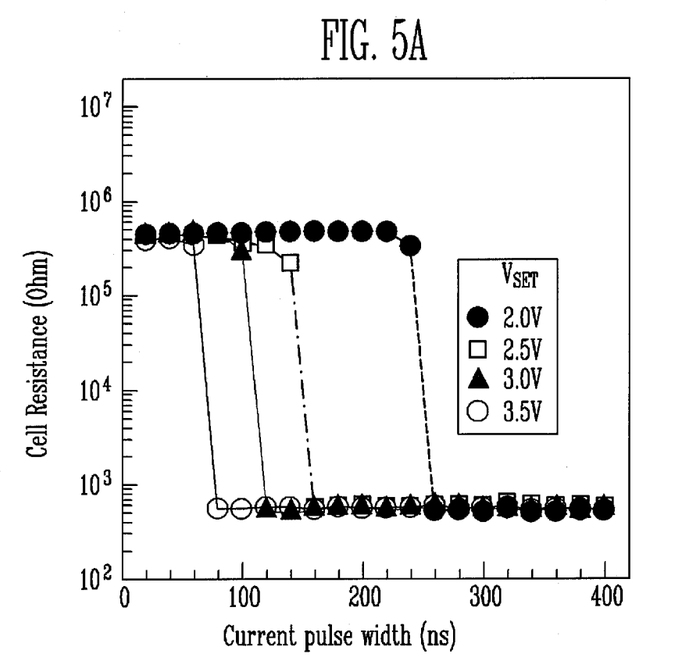
FIG. 5A is a graph of a set operating speed of a PRAM according to an exemplary embodiment of the present invention.
Figure 5B:
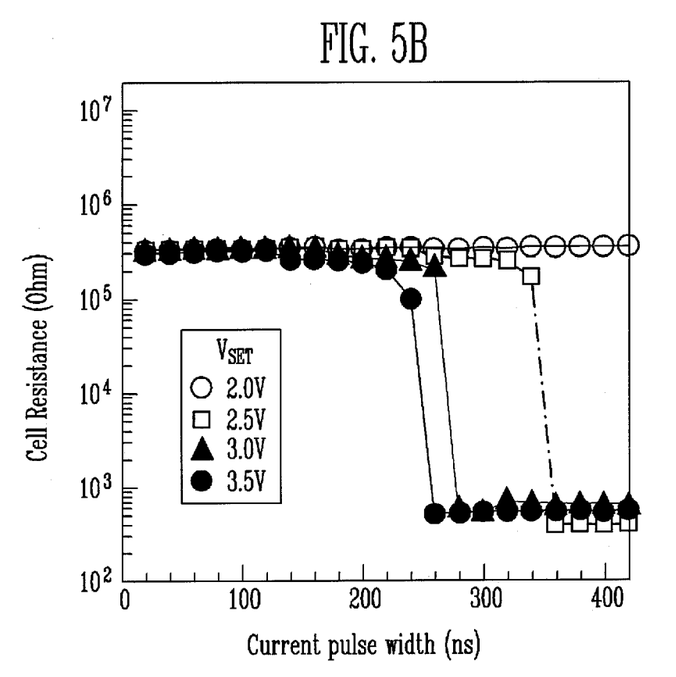
FIG. 5B is a graph of a set operating speed of a comparative PRAM.

FIG. 5A is a graph of a set operating speed of a PRAM according to an exemplary embodiment of the present invention, and FIG. 5B is a graph of a set operating speed of a comparative PRAM.

In order to compare the set operating speed of the PRAM according to the present invention with that of the comparative device, a PRAM having a phase-change material layer comprised of a 2000 Å-thick $Ge_{18}Sb_{39}Te_{43}$ region and 500 Å-thick $Ge_2Sb_2Te_5$ regions disposed respectively on and under the $Ge_{18}Sb_{39}Te_{43}$ region was prepared as the PRAM according to the present invention, and a PRAM having a phase-change material layer comprised of a 3000 Å-thick single $Ge_{18}Sb_{39}Te_{43}$ phase-change material layer was prepared as the comparative PRAM.

Referring to FIG. 5A, in the case of the PRAM according to the present invention, when a set program voltage varied from 2.0V to 3.5V, the pulse width of an operating voltage required for transition from a reset state to a set state was reduced from 260 ns to 80 ns. By comparison, referring to FIG. 5B, in the case of the comparative PRAM using the single $Ge_{18}Sb_{39}Te_{43}$ phase-change material layer, when a set program voltage varied from 2.5V to 3.5V, the pulse width of an operating voltage required for transition from a reset state to a set state was changed from 360 ns to 260 ns.

In other words, when the width of a minimum operating voltage required for transition to a set state with application of a sufficient set program voltage is defined as a set operating speed, it can be seen that the PRAM according to the present invention may perform a set operation at much higher speed than the comparative PRAM.

Figure 6A:
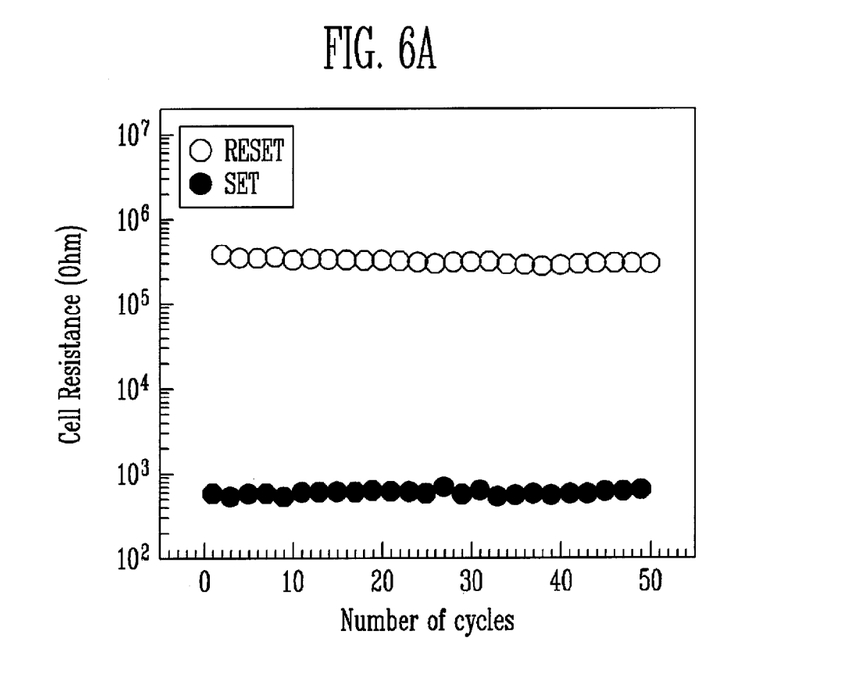
FIG. 6A is a graph of set and reset resistances of a PRAM according to an exemplary embodiment of the present invention.
Figure 6B:
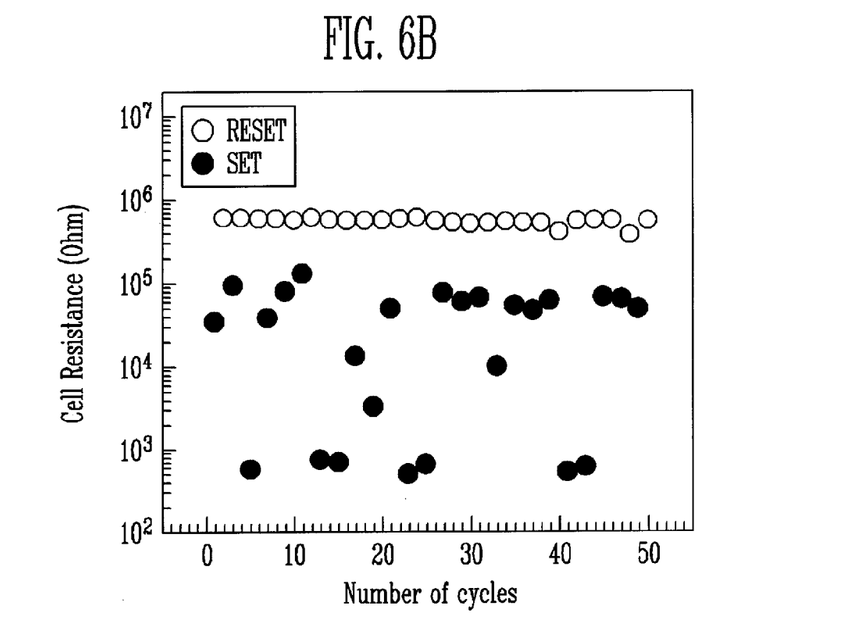
FIG. 6B is a graph of set and reset resistances of a comparative PRAM.

FIG. 6A is a graph of set and reset resistances of a PRAM according to an exemplary embodiment of the present invention, and FIG. 6B is a graph of set and reset resistances of a comparative PRAM.

In order to compare variations in the set and reset resistances of the PRAM according to the present invention with those of the comparative PRAM, a PRAM having a phase-change material layer comprised of a 2000 Å-thick $Ge_{18}Sb_{39}Te_{43}$ region and 500 Å-thick $Ge_2Sb_2Te_5$ regions disposed respectively on and under the $Ge_{18}Sb_{39}Te_{43}$ region was prepared as the PRAM according to the present invention, and a PRAM having a 3000 Å-thick single $Ge_2Sb_2Te_5$ phase-change material layer was prepared as the comparative PRAM.

Referring to FIG. 6A, in the case of the PRAM according to the present invention, it can be seen that when set and reset operations were repeated, set and reset resistances were maintained at almost constant levels. In contrast, referring to FIG. 6B, in the case of the comparative PRAM, it can be observed that when set and reset operations were repeated, a set resistance fluctuated within a relatively large range.

As described above, the PRAM according to the present invention employed the Sb-excess $Ge_2Sb_{2+x}Te_5$ phase-change material layer, thereby stabilizing the resistance of the phase-change material in a crystalline phase. It can be seen that about the same effect could be produced even if $Ge_2Sb_2Te_5$ subsidiary regions were respectively disposed on and under a $Ge_2Sb_{2+x}Te_5$ main operating region.

Figure 7A:
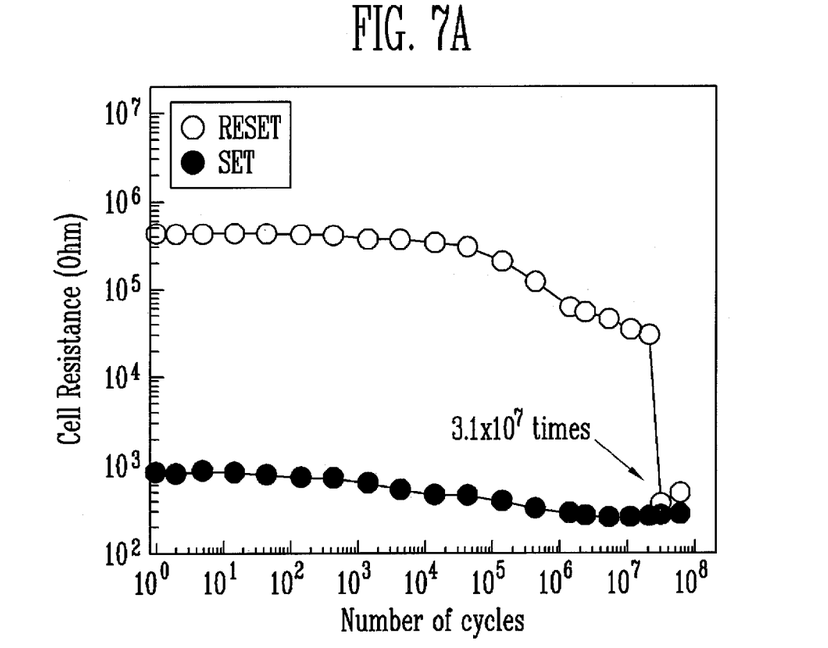
FIG. 7A is a graph showing repeated write characteristics of a PRAM according to an exemplary embodiment of the present invention.
Figure 7B:
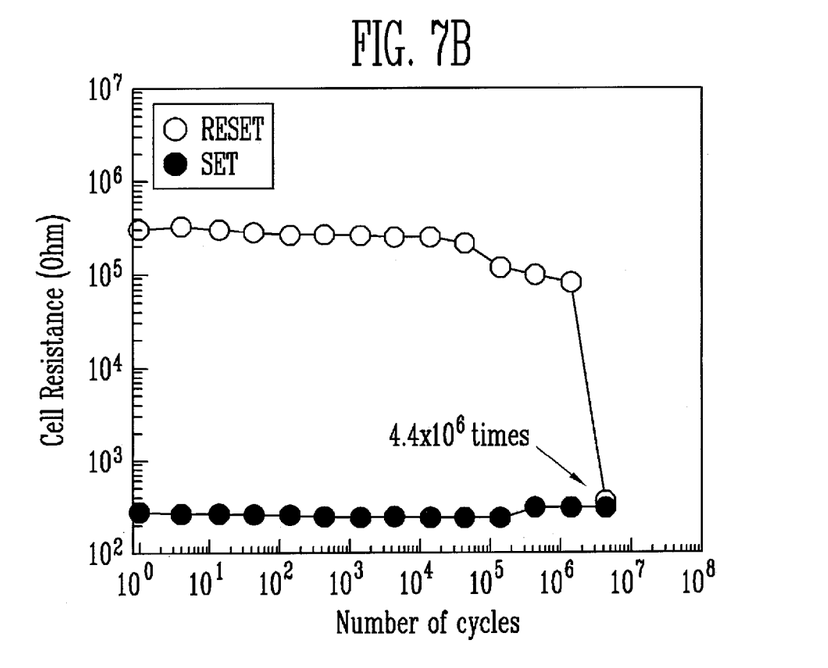
FIG. 7B is a graph showing repeated write characteristics of a comparative PRAM.

FIG. 7A is a graph showing repeated write characteristics of a PRAM according to an exemplary embodiment of the present invention, and FIG. 7B is a graph showing repeated write characteristics of a comparative PRAM.

In order to compare the repeated write characteristics of the PRAM according to the present invention with those of the comparative PRAM, a PRAM having a phase-change material layer comprised of a 2000 Å-thick $Ge_{18}Sb_{39}Te_{43}$ region and 500 Å-thick $Ge_2Sb_2Te_5$ regions disposed respectively on and under the $Ge_{18}Sb_{39}Te_{43}$ region was prepared as the PRAM according to the present invention, and a PRAM having a 3000 Å-thick single $Ge_{18}Sb_{39}Te_{43}$ phase-change material layer was prepared as the comparative PRAM.

Referring to FIG. 7A, when the PRAM according to the present invention repeated set and reset write operations about $3 \times 10^7$ times, a set-stuck failure occurred to disable further reset programming. By comparison, referring to FIG. 7B, the comparative PRAM suffered from a set-stuck failure after set and reset write operations were repeated about $4 \times 10^6$ times. Accordingly, it can be seen that the PRAM according to the present invention could repeat a write operation about 10 times more than the comparative PRAM.

As explained thus far, when a PRAM uses an Sb-excess $Ge_2Sb_{2+x}Te_5$ phase-change material layer, the Sb excess and elements of electrode layers may diffuse into each other to degrade the operating reliability of the PRAM. However, a PRAM according to the present invention includes a phase-change material layer having $Ge_2Sb_2Te_5$ subsidiary regions disposed respectively on and under a $Ge_{18}Sb_{39}Te_{43}$ main operating region. Therefore, inter-diffusion between the phase-change material layer and the electrode layer can be prevented, thereby increasing the number of times the PRAM is capable of repeating a write operation.

According to the present invention, a main operating region functioning as a memory operating region is formed of a $Ge_2Sb_{2+x}Te_5$ phase-change material to ensure the stability of a memory operation, and simultaneously, subsidiary regions formed of a $Ge_2Sb_2Te_5$ phase-change material are disposed respectively on and under the $Ge_2Sb_{2+x}Te_5$ main operating region to prevent leakage of thermal energy through an electrode, thereby reducing power consumption.

Also, since the $Ge_2Sb_2Te_5$ subsidiary regions are disposed respectively on and under the $Ge_2Sb_{2+x}Te_5$ main operating region, the crystallization speed of the main operating region can be accelerated using crystal nuclei generated in the $Ge_2Sb_2Te_5$ phase-change material constituting the subsidiary regions. As a result, the operating speed of the entire PRAM can be enhanced.

Furthermore, since the $Ge_2Sb_2Te_5$ subsidiary regions are disposed respectively on and under the Sb-excess $Ge_2Sb_{2+x}Te_5$ main operating region, inter-diffusion between Sb contained in the $Ge_2Sb_{2+x}Te_5$ main operating region and elements of electrode layers can be prevented, thereby increasing the number of times the PRAM is capable of repeating a write operation.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A phase-change memory device comprising:
a first electrode layer formed over a substrate;
a heater electrode layer formed over the first electrode layer;
a first insulating layer formed over the heater electrode layer;
a phase-change material layer formed over the heater electrode layer; and
a second electrode layer formed over the phase-change material layer,
wherein the phase-change material layer comprises:
a main operating region including Sb-excessive (Ge—Sb—Te) material having a single-phase crystalline structure; and
subsidiary regions disposed respectively over and under the main operating region and including (Ge—Sb—Te) material having two-phase crystalline structures.

2. The device according to claim 1, wherein the main operating region includes a phase-change material expressed by formula: $Ge_2Sb_{2+x}Te_5$ ($0.12 \leq x \leq 0.32$), and the subsidiary regions include a phase-change material expressed by formula: $Ge_2Sb_2Te_5$, respectively.

3. The device according to claim 1, wherein the main operating region is thicker than the subsidiary regions.

4. The device according to claim 1, wherein the subsidiary regions comprise:
a first subsidiary region disposed under the main operating region; and
a second subsidiary region disposed over the main operating region.

5. The device according to claim 4, wherein the thickness of the main operating region is at least twice the sum of the thickness of the first and second subsidiary regions.

6. The device according to claim 4, wherein each of the first and second subsidiary regions has a thickness of about 500 to 1000 Å.

7. The device according to claim 1, wherein the width of the phase-change material layer is about 50 to 500 nm.

8. The device according to claim 1, further comprising a second insulating layer formed on the phase-change material layer and having a via hole exposing the phase-change material layer,
wherein the second electrode layer is in contact with the phase-change material layer through the via hole.

9. The device according to claim 1, wherein the heater electrode layer is formed of one selected from the group consisting of titanium nitride (TiN), titanium oxynitride (TiON), titanium aluminum nitride (TiAlN), titanium silicon nitride (TiSiN), tantalum aluminum nitride (TaAlN), tantalum silicon nitride (TaSiN), and silicon germanium (SiGe).

10. A method of fabricating a phase-change memory device,
comprising:
providing a substrate;
forming a first electrode layer on the substrate;
forming a heater electrode layer on the first electrode layer;
forming a first insulating layer on the heater electrode layer;
forming a pore partially exposing the heater electrode layer in the first insulating layer;
forming a phase-change material layer partially contacting the heater electrode layer in the pore; and
forming a second electrode layer on the phase-change material layer,
wherein the phase-change material layer comprises:
a mam operating region formed of a germanium (Ge)-antimony (Sb) tellurium (Te) phase-change material; and
subsidiary regions disposed respectively on and under the main operating region and formed of a Ge—Sb—Te phase-change material having a different composition from the main operating region.

11. The method according to claim 10, wherein the main operating region is formed of a phase-change material expressed by formula:
$Ge_2Sb_{2+x}Te_5$ (0.12<x<0.32), and the subsidiary region is formed of a phase-change material expressed by formula: $Ge_2Sb_2Te_5$.

12. The method according to claim 11, wherein the forming of the phase-change material layer comprises:
forming the main operating region by a sputtering process using a $Ge_2Sb_2Te_5$ target and an Sb target; and
forming the subsidiary region by a sputtering process using a $Ge_2Sb_2Te_5$ target.

13. The method according to claim 10, wherein the forming of the phase-change material layer comprises patterning the main operating region and the subsidiary region in the pore using a dry etching process, a wet etching process, a lift-off process, or a chemical mechanical polishing (CMP) process.

14. The method according to claim 10, wherein the forming of the phase-change material layer comprises forming the main operating region to a greater thickness than the subsidiary region.

15. The method according to claim 10, wherein the subsidiary region comprises:
a first subsidiary region disposed under the main operating region; and
a second subsidiary region disposed on the main operating region.

16. The method according to claim 15, wherein the forming of the phase-change material layer comprises forming the main operating region to a thickness that is at least twice the sum of the thicknesses of the first and second subsidiary regions.

17. The method according to claim 15, wherein the forming of the phase-change material layer comprises forming each of the first and second subsidiary regions to a thickness of about 500 to 1000 Å.

18. The method according to claim 10, wherein the forming of the pore comprises forming the pore to a size of about 50 to 500 nm.

19. The method according to claim 10, further comprising, before forming the second electrode layer:
forming a second insulating layer on the phase-change material layer; and
forming a via hole exposing the phase-change material layer in the second insulating layer,
wherein the second electrode layer is in contact with the phase-change material layer through the via hole.

* * * * *